(12) United States Patent
Lilamwala

(10) Patent No.: US 7,057,544 B2
(45) Date of Patent: Jun. 6, 2006

(54) DIRECT CHARGE TRANSFER DIGITAL TO ANALOG CONVERTER HAVING A SINGLE REFERENCE VOLTAGE

(75) Inventor: Murtuza Lilamwala, Aliso Viejo, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/849,659

(22) Filed: May 19, 2004

(65) Prior Publication Data
US 2005/0258994 A1    Nov. 24, 2005

(51) Int. Cl.
*H03M 1/66* (2006.01)
(52) U.S. Cl. .................. 341/150; 341/144; 341/172
(58) Field of Classification Search ........ 341/143–144, 341/150, 155, 172
See application file for complete search history.

(56) References Cited

U.S. PATENT DOCUMENTS

| | | | |
|---|---|---|---|
| 4,584,568 A * | 4/1986 | Zomorrodi | 341/150 |
| 4,746,903 A * | 5/1988 | Czarniak et al. | 341/144 |
| 5,206,648 A * | 4/1993 | Yukawa | 341/150 |
| 5,712,634 A * | 1/1998 | Janssen | 341/144 |
| 5,821,891 A * | 10/1998 | Shi et al. | 341/143 |
| 5,923,275 A * | 7/1999 | Kalb | 341/150 |
| 6,016,115 A * | 1/2000 | Heubi | 341/161 |
| 6,169,509 B1 * | 1/2001 | Abe | 341/150 |
| 6,437,720 B1 * | 8/2002 | Yin et al. | 341/150 |

OTHER PUBLICATIONS

John A. C. Bingham, "Applications of a Direct-Transfer SC Integrator", IEEE Transactions on Circuits and Systems, vol. CAS-31, No. 4, Apr. 1984, pp. 419-420.

Ichiro Fujimori and Tetsuro Sugimoto, "A 1.5 V, 4.1 mW Dual-Channel Audio Delta-Sigma D/A Converter", IEEE Journal of Solid-State Circuits, vol. 33, No. 12, Dec. 1998, pp. 1863-1870.

* cited by examiner

*Primary Examiner*—Rexford Barnie
*Assistant Examiner*—Khai Nguyen
(74) *Attorney, Agent, or Firm*—Weide & Miller, Ltd.

(57) ABSTRACT

A direct charge transfer digital to analog converter comprising a single reference voltage linked through a switching structure to a charge accumulation device. An accumulated charge of the charge accumulation system represents the analog output voltage. Use of the single reference voltage in conjunction with the switching structure and charge accumulation system allows for a digital signal to be converted to an analog signal with lower power consumption. Use of a single reference voltage consumes less power and space thereby making it superior to prior art digital to analog conversion systems.

25 Claims, 14 Drawing Sheets

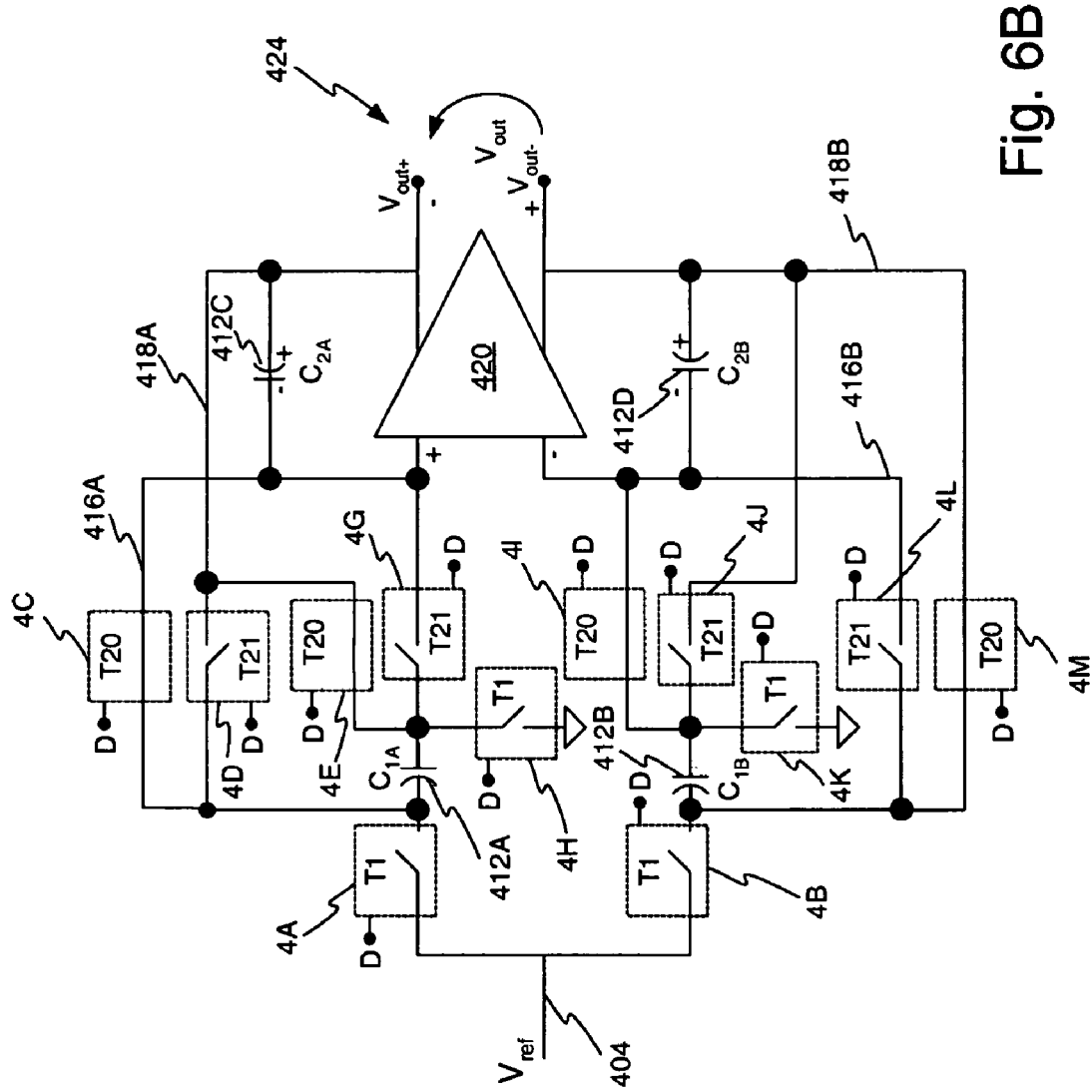

DIRECT CHARGE TRANSFER DIGITAL TO ANALOG CONVERTER HAVING A SINGLE REFERENCE VOLTAGE

FIELD OF THE INVENTION

The invention relates to digital to analog converters and in particular to direct charge sample and hold structures.

RELATED ART

As is commonly understood, electronic devices are prevalent throughout the world. These devices often utilize signals or processing of signals in a digital format because digital signals or digital signal processing may have numerous advantages over working with or utilizing signals that are in the analog domain. For example, communication devices often receive an analog voice signal from a microphone, and convert this signal to a digital format for processing. It may, however, be necessary to reconvert the signal to an analog format, such as for transmission or for presentation to a speaker. This procedure often occurs in cellular telephones or wireless communication devices and personal entertainment devices, such as music players, video players, and other such devices that process digital data in this manner.

Conversion of a digital signal to an analog format is often performed utilizing a digital to analog (D/A) converter. Traditionally, D/A converters sample a digital signal and convert the value of the digital signal into an analog format. Over time, numerous digital bits, which form the digital signal, may be combined to form an analog signal.

One particular structure that converts a digital signal into an analog signal comprises a direct charge transfer digital to analog converter. The direct charge transfer structure utilizes a digital input signal to supply a charge to one or more charge storage devices of the digital to analog converter. A direct charge transfer structure reduces power consumption because the amplifier does not have to provide the current to charge the capacitors compared to other charge based digital to analog converters. As a result, the direct charge transfer structure for digital to analog converters can extend the operational time per charge for electronic devices that utilize battery power. Consequently, a direct charge transfer structure is widely utilized in digital to analog converters for modern communication and entertainment devices that utilize battery power.

Prior art direct charge transfer D/A (digital to analog) structures utilize two voltage sources or levels to accurately generate the resulting analog signal. While such a structure accurately retrieves the analog signal, it suffers from the drawback of requiring two separate reference voltages. In general, each reference voltage requires a separate buffer amplifier, each of which consumes power resources. In addition to consuming valuable power resources, each buffer amplifier increases the complexity and size of the digital to analog converter. This undesirably reduces the operating life of a battery operated electronic device that utilizes this prior art structure, and due to its increased size and complexity may undesirably increase the cost of such a device. As a result there is a need in the art for an analog to digital converter structure which does not suffer from these drawbacks.

SUMMARY

The method and apparatus disclosed herein overcomes the drawbacks of the prior art by providing a direct charge transfer structure for digital to analog conversion that utilizes a single reference voltage. This reduces power consumption as compared to prior art digital to analog converters that utilize two or more reference voltages.

In one embodiment, a method is disclosed for converting a digital signal to an analog signal utilizing a single reference voltage. This method comprises use of a reference voltage and a first switch. The first switch has a first terminal connected to the reference voltage. This method also connects a second terminal of the first switch to a bottom plate of a capacitor. This capacitor also has a top plate. There may also be one or more additional switches connected to the bottom plate and top plate of the capacitor. Then, during a first time period, the method controls the switch to connect the bottom plate of the capacitor to the reference voltage to thereby charge the capacitor to the reference voltage. During a second time period, and responsive to a digital signal, this method selectively connects either the top plate or the bottom plate of the capacitor to an output of an amplifier to generate an output signal representative of the digital value.

It is contemplated that in one embodiment the bottom plate of the capacitor is charged to the reference voltage and that the charge may be provided to an amplifier. In one embodiment, providing the charge on the capacitor to an amplifier comprises providing the charge to either an amplifier input or an amplifier output. As discussed below in more detail, the charge on the capacitor may be directly coupled to the output.

Also disclosed is a method for performing a direct charge transfer digital to analog conversion, comprising the steps of receiving a single bit or multi-bit digital signal and providing the digital signal to one or more switch assemblies, one or more capacitors, or both. The method then connects the one or more switch assemblies and/or capacitors to one reference voltage source to thereby establish a charge across one or more capacitors. Responsive to the digital signal, this method of operation selectively connects the charge established within one or more capacitors to an output of an operational amplifier using one or more switch assemblies to thereby convert the digital signal to an analog signal.

In one variation of this embodiment, the one or more switch assemblies comprise capacitors and switches and the charge may be established on one or more capacitors. In addition, the step of selectively connecting the charge established within the capacitors to an output comprises selectively connecting the top plate or bottom plate of one or more capacitors across the input and output of an amplifier. The amplifier may comprise a single output or a differential output.

Also disclosed herein is a system for converting a digital signal to an analog signal. In one example embodiment, this system comprises a reference voltage node configured to provide a charge and a charge collection device configured to store a charge. A first switch assembly having at least one switch is also provided and is configured to selectively connect the charge collection device to the reference voltage node. Further, a second switch assembly having at least one switch configured to selectively convey the charge of the charge collection device to an output of the system, wherein the at least one switch of the second switch bank is responsive to the digital signal.

As discussed below in more detail, the charge collection device may comprise a capacitor. In one embodiment, the system further comprises an amplifier and charge accumulation device connected to the output of the system to hold the analog voltage over time. In addition, the second switch assembly may comprise two or more switches configured to connect the charge to either of a positive output or a negative output of the system.

In one embodiment, a digital signal to analog signal converter is configured to have an electrical charge source and one or more charge storage devices. Also included are one or more switches configured to connect, during a first time period, the one or more charge storage devices to the charge source and one or more switches configured to connect the one or more charge storage devices to an output node of the digital signal to analog signal converter. In addition, connecting the one or more charge storage devices to an output node occurs during a second time period and is responsive to the digital signal.

It is also contemplated that the one or more switches configured to connect the charge storage device to an output node comprise one or more switches configured to connect the charge to a positive output node in response to a digital one value and one or more switches configured to connect the charge to a negative output node in response to a digital zero value. In one embodiment, the negative output node and the positive output node comprise output nodes of a differential amplifier. It is also possible to use an amplifier that has only one output. This system may further comprise one or more output capacitors configured to hold a charge over time to thereby maintain an analog signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 6B illustrates a block diagram of the structure of FIG. 4, during a second time period T2, for a digital zero input.

DETAILED DESCRIPTION

Figure 1:
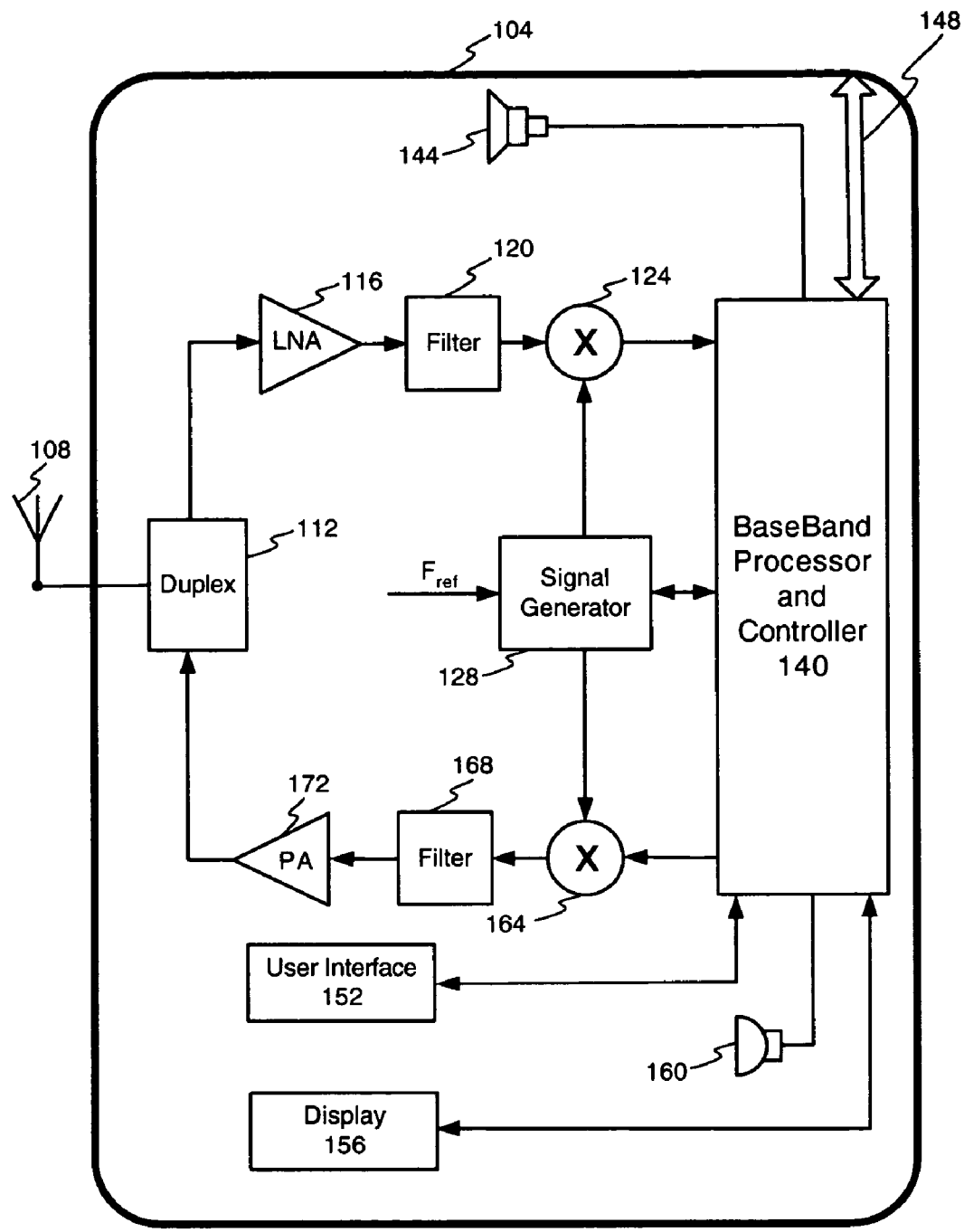
FIG. 1 illustrates a block diagram of example environment of use in a wireless communication device.

FIG. 1 illustrates a block diagram of a first example environment of use of the invention. The example environment shown in FIG. 1 comprises a wireless communication device but it is noted that this is but one of many possible example environments of use. It is contemplated that the invention may find use and benefit in numerous other environments both in the communication field and other fields of use.

The wireless communication device shown in FIG. 1 comprises an outer housing 104 configured to protect and selectively enclose the internal electronic apparatus. An antenna 108 receives incoming signals and transmits outgoing signals. The antenna 108 may be located inside or outside of the housing 104. A duplexer 112 connects to the antenna 108 to route incoming signals to a receiver apparatus, shown as the upper path from the duplexer 112 and route outgoing signals to the antenna.

The duplexer 112 connects to a receiver apparatus to hereby route received signals to a low noise amplifier (LNA) 116 that is configured to increase the signal power level for a particular frequency band to a level appropriate for processing by subsequent apparatus. The LNA 116 output connects to a filter 120 which may be configured to perform additional filtering or processing, such as for example band pass filtering or processing to mitigate the effects of the wireless channel.

After filtering, a mixer 124, also known as a down-converter, processes the received signal in conjunction with a signal from a signal generator 128. The mixer may be configured to extract a baseband signal by multiplying the received signal at a carrier frequency with a signal from the signal generator that is also at the carrier frequency. As is well understood, the mixer 124 outputs the desired carrier signal.

The output from the mixer 124 feeds into a baseband processor and controller 140 that is configured to receive and process the incoming baseband signal. In one embodiment, the baseband processor and controller 140 converts the incoming signal to a digital format, processes the digital signal, and then creates an analog signal which is provided to a speaker 144. Alternatively the digital signal may be provided directly to a data port 148. In this embodiment, the baseband processor and controller 140 is in communication with the signal generator 128 to synchronize operation.

The baseband processor and controller 140 is also configured to communicate data to and from a user interface 152, such as with one or more keys or buttons, and a display 156 configured to display text, graphics, or other information to a user.

To perform transmission of outgoing signals, the baseband processor and controller 140 may receive a signal from a microphone 160 or digital data from the data port 148. Upon receipt of an outgoing signal, the baseband processor and controller 140 processes the outgoing information to a baseband signal and outputs this baseband signal to a mixer 164, which may also be referred to as an up-converter. The mixer 164 multiplies the baseband signal with an input from the signal generator 128 at the desired carrier frequency. The resulting outgoing signal comprises the baseband signal modulated to the carrier frequency and is ready for filtering and processing by the filter 168 and then amplification by a power amplifier 172 to a power level suitable for transmission by the antenna 108 after passing through the duplexer 112.

Figure 2:
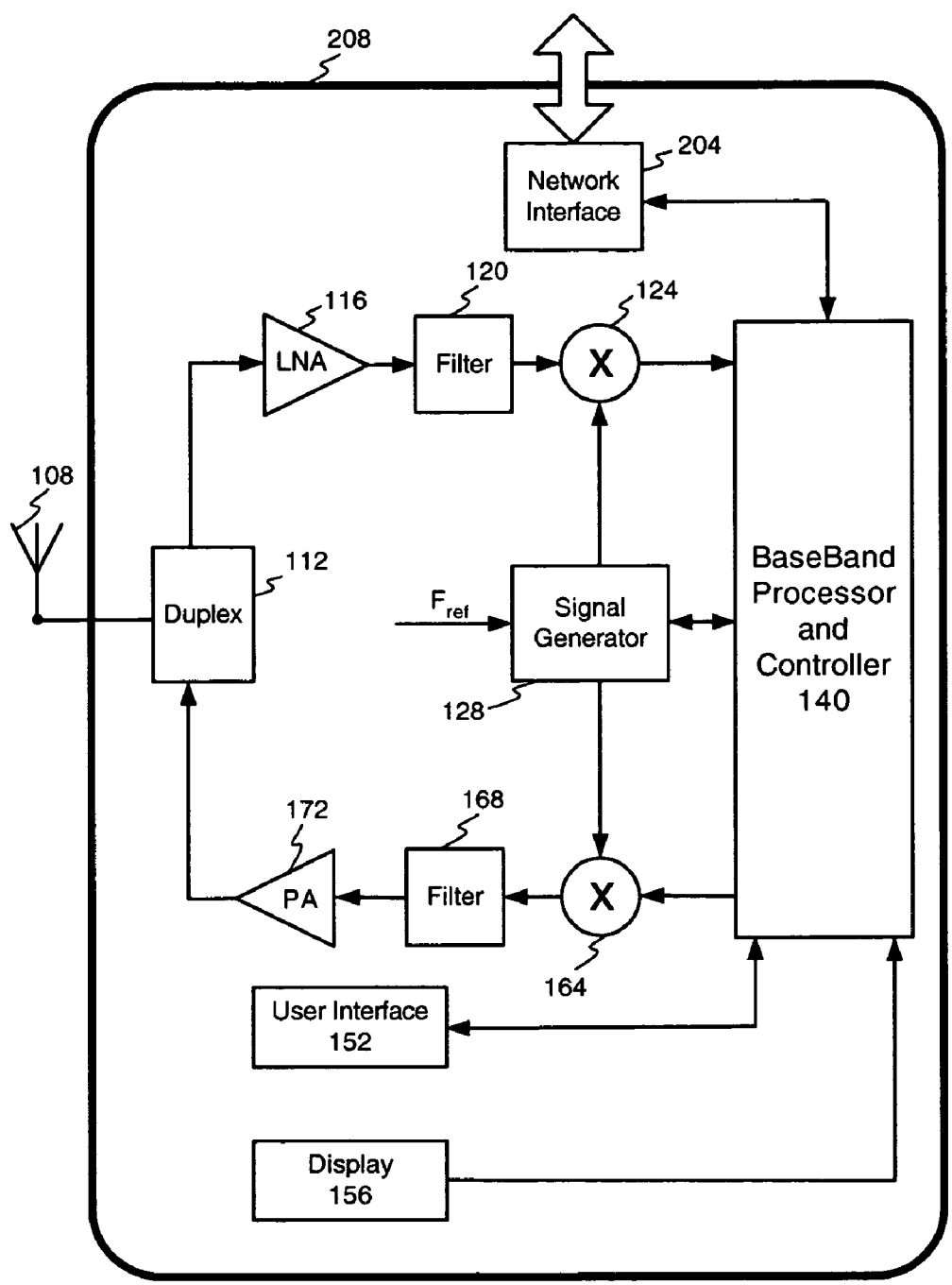
FIG. 2 illustrates a block diagram of example environment of use in a base station.

FIG. 2 illustrates a block diagram of a second example environment of use of the invention. FIG. 2 shares numerous similarities with FIG. 1 and thus, only the aspects that differ from FIG. 1 are discussed in detail. FIG. 2 is directed to a base station 208 or non-mobile communication device configured to communicate with one or more other communication devices. In this configuration, which may represent a base station communication system 208, the baseband processor and controller 140 communicate with a network interface 204. The network interface 204 may be configured to receive one or more signals or packet-based-data from the processor and controller 140. The one or more signals or packet-based-data is output to a computer network, internet, PSTN, or other medium that interfaces with a telephone network, data network, or cellular communication system. When configured as a base station 208, the system shown in FIG. 2 facilitates completion of a mobile telephone call, such as a telephone call from a cell phone or to a land line. These calls are often completed via the network interface 204 of the base station 208.

Figure 3:
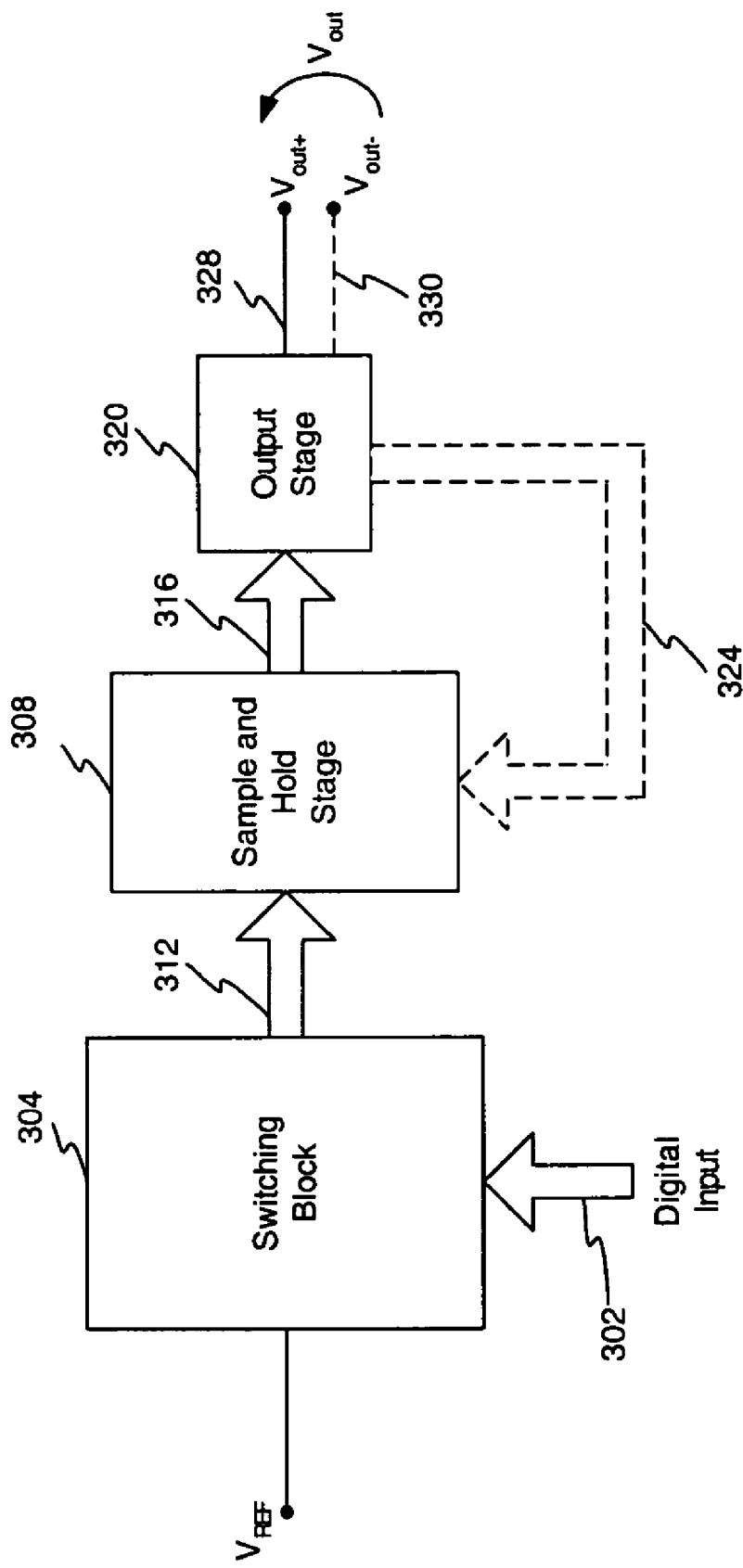
FIG. 3 illustrates a block diagram of an example embodiment of a direct charge transfer structure.

FIG. 3 illustrates a block diagram of an example embodiment of a direct charge transfer structure having a single reference voltage. As used herein, the term reference voltage is defined to mean any source of electrical charge such as a voltage source, current source, or any other source of charge. In addition, the embodiment of FIG. 3 is but one example embodiment and, as such, the claims that follow should not be considered as being limited to this particular configuration. It is fully contemplated that one of ordinary skill in the art, upon reading this disclosure, may enable other embodiments that are within the scope of the claims. As shown in FIG. 3, a reference voltage ($V_{ref}$) connects to a switching block 304. The switching block 304 also receives a digital signal on digital input 302. In this embodiment, the digital signal comprises the digital signal that is being converted to an analog format. As can be seen from FIG. 3, the system utilizes a single reference voltage thereby overcoming the drawbacks of the prior art which require two or more reference voltages, which are at different or opposite voltages.

The switching block 304 may comprise one or more switches, transistors, gating devices, multiplexer, or any other device capable of selectively controlling signal flow between two or more nodes. In one embodiment, the digital signal received over input 302 controls the switching block and thus, the flow of the reference voltage, also referred to herein as charge, to a sample and hold stage 308. The digital input 302 may comprise a single input or a multi-conductor path or bus. In one embodiment, the digital signal comprises a one-bit digital signal that controls the phase of one or more clocks or synchronization devices. In such an embodiment, the one-bit signal may arrive from a digital sigma delta modulator.

Connecting the sample and hold stage 308 are interconnections 312 which may comprise one or more interconnects, conductors, signal paths, or any other means capable of conveying charge.

The sample and hold stage 308 comprises one or more charge accumulation devices such as, but not limited to, capacitors, and/or inductors. Responsive to the digital signal, which controls the switching block 304, charge accumulates on the one or more charge accumulation devices within the sample and hold stage 308. Via inter-connects 316 the accumulated charge in the sample and hold stage is provided to an output stage 320. The inter-connects 316, like inter-connects 312 may comprise a single conductor, multiple conductors, or any path capable of conveying a charge or a signal. The output stage 320 may comprise one or more amplifiers, buffers, registers or any other device configured to output the charge from the sample and hold stage 308. In one embodiment, the output stage 320 serves as an accumulator to thereby integrate the charge from the sample and hold stage 308 over one or more cycles of operation.

Shown with the dashed line is an optional feedback path 324 configured to provided a feedback signal to the sample and hold stage 308 from the output stage 320. The feedback path 320 may be configured as part of the accumulation function to thereby accumulate charge on one or more devices of the sample and hold stage 308.

The output stage 320 has an output node 328 configured to provide an output to the accumulated charge resulting from the operation of the system of FIG. 3. It is contemplated that over time the signal on output node 328 comprises an analog representation of the digital signal received on digital input 302. Shown in dashed lines is an optional output node 330 which, when utilized, allows for a differential signal between the nodes 328 and 330. In such a configuration, $V_{out}$ represents the differential signal between $V_{out+}$ on node 328 and $V_{out-}$ on node 330.

As an advantage over the prior art, the charge transfer structure shown in FIG. 3 utilizes a single reference voltage. As compared to prior art embodiments, this reduces power consumption, integrated circuit space requirements, and complexity. Prior art embodiments which utilize two or more different reference voltages require additional buffer amplifiers and associated circuitry which in turn increases power consumption, space consumption, and complexity. Adopting the structure of FIG. 3 increases integrated circuit wafer utilization and efficiency, thereby reducing cost and increasing reliability.

Figure 4:
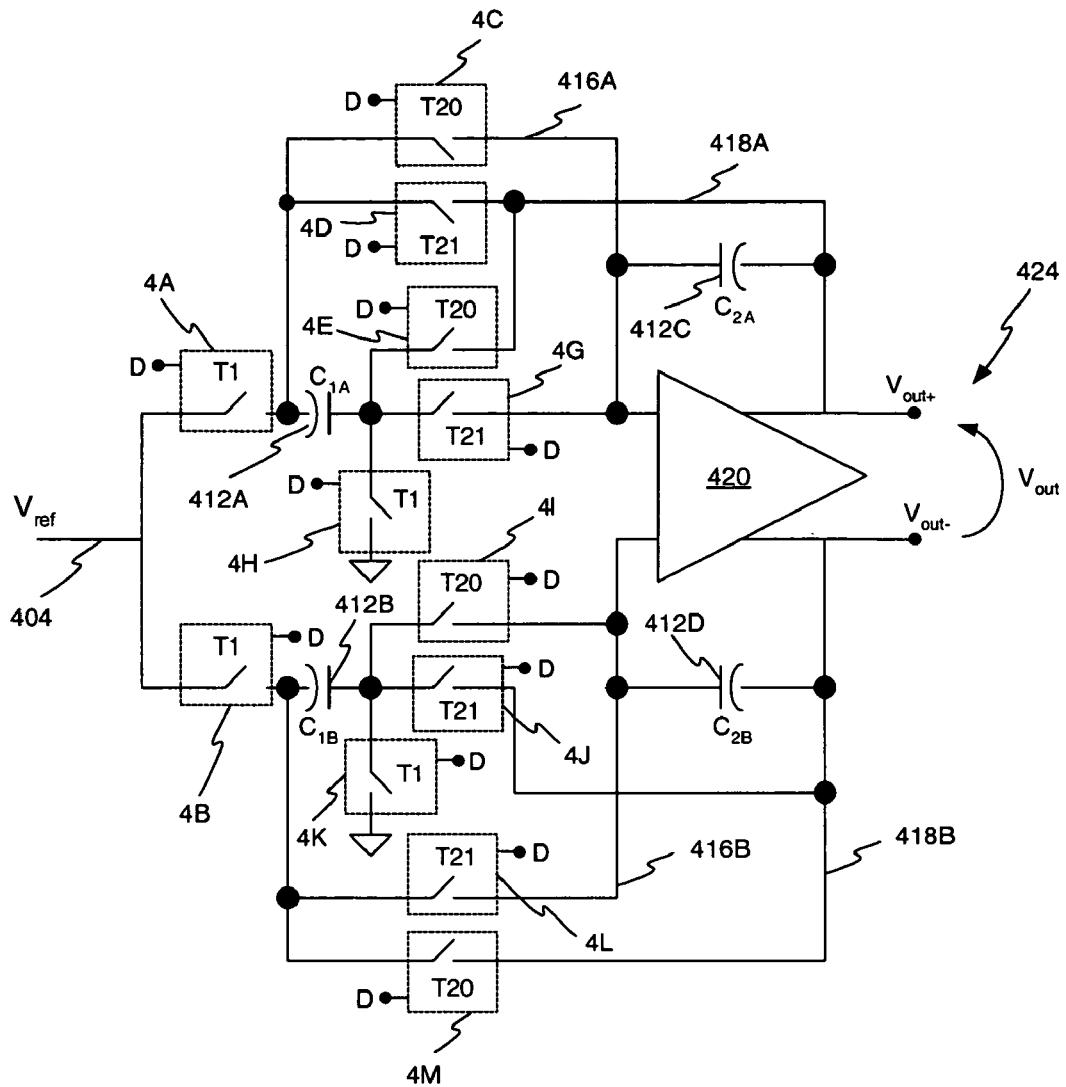
FIG. 4 illustrates an example embodiment of a direct charge transfer digital to analog converter structure.

FIG. 4 illustrates an example embodiment of a direct charge transfer digital to analog converter structure. As this is an example embodiment, it is contemplated that one of ordinary skill in the art may arrive at other embodiments that do not depart from the scope of the claims that follow. As can be seen in FIG. 4, the structure shown utilizes a single reference voltage 404 thereby overcoming the requirements and drawbacks of the prior art which required two or more reference voltages.

In general, the structure of FIG. 4 comprises one or more switching structures, such as switching block 4A, one or more charge collectors, such as capacitor 412A (also referred to as $C_{1A}$), an output amplifier or buffer 420, and a single reference voltage 404. To distinguish the two plates of the capacitor, one plate of the capacitor is shown with a curved line (also called the bottom plate) and the other plate is shown by a straight line (also called the top plate). In one embodiment, the switching structures 4 (4A–4M) are controlled by a switch control signal, and in this embodiment, the digital input D. Responsive to the digital signal D, the switch structures 4 generate an analog output voltage $V_{out}$ which comprises the analog representation of the digital signal.

Turning now to the particulars of FIG. 4, a reference voltage 404 is provided to switch block 4A and switch block 4B. A switch block 4 may comprise any structure capable of opening or closing a conductive path responsive to a control signal connected to D. It is contemplated that a switch block 4 may comprise a switch, transistor, multiplexer, logic gate, or any other structure capable of performing as described herein. In one embodiment, for the switches 4A and 4B, a clock signal is connected to the control terminal. In this embodiment, for switches 4C–4M, the digital signal D serves as a control signal to at least one of the switch blocks and also represents the digital signal that is being converted to an analog format. Thus, responsive to the digital signal, which is being converted to an analog signal, the switches are selectively opened and closed during different stages or time periods of operation of the structure of FIG. 4. Thus, the digital input is provided to at least one of the switch blocks 4 as shown.

The output of switch block 4A connects to switch block 4C, switch block 4D, and capacitor 412A. Switch block 4C and subsequent switch blocks are configured generally similar to switch block 4A and hence, subsequent switch blocks are not described in detail as such description would simply be repetitive. The capacitor 412A comprises any charge collection device capable of accumulating a charge responsive to the reference voltage on input 404. Charge collection devices other than a capacitor may be utilized.

The top plate of capacitor 412A connects to switch block 4E, 4G, and 4H as shown. The output of switch block 4H connects to ground, floating ground, or chassis ground or any other reference voltage of the system. The outputs of switch block 4C and 4G connect to a node 416A which in turn connects to an input of an amplifier 420. The outputs of switch block 4D and 4E connect to a node 418A which in turn connects to an output of the amplifier 420. Node 416A and node 418A connect to opposing ends of a capacitor 412C ($C_{2A}$), which is inter-connected between the input and output of the amplifier 420. The capacitor 412C also serves as a charge collection device and in this embodiment holds a charge across the operational amplifier input and output terminals.

The lower portion of the structure of FIG. 4, which is progressing from the output of switch block 4B, is generally similar to that described above, and hence, is not described in detail beyond that discussed below. A second input to the amplifier 420 connects to a node 416B while a second output of the amplifier connects to a node 418B. Nodes 416B and 418B are inter-connected by a capacitor 412D ($C_{2B}$).

In this embodiment, the amplifier 420 comprises a differential amplifier configured to amplify or buffer the inputs and provide the differential signal $V_{out}$ across the outputs 424. In particular, $V_{out}$ represents the difference between $V_{out+}$ and $V_{out-}$. The amplifier 420 may comprise a differential amplifier, with one or more outputs, or any other device configured to perform as described herein.

In operation, the switch blocks 4A and 4B are controlled, responsive to the one phase of the clock signal, to charge capacitors C1A and C1B to the reference voltage 404 and ground. During the second phase of the clock signal, the digital inputs connect the capacitors C1A and C1B across the input and output terminals of the amplifier. Depending on the value of the digital signal, the top plate of capacitor C1A is connected to the amplifier output $V_{out+}$ and the bottom plate of capacitor C1A is then connected to the amplifier input node 416A. At the same time, the bottom plate of capacitor C1B is connected to the amplifier output $V_{out-}$ and the top plate of capacitor C1B is then connected to the amplifier input node 416B. As a result, the digital input, controls the accumulation of charge on the capacitors 412C and 412D. This, in turn, generates an output voltage, which over time accumulates to form an analog representation of the digital signal.

Associated with each switch block 4 is a numeric identifier, such as a two or three digit numeric identifier, that identifies how the switch will operate in response to a digital one value or a digital zero value. In particular, operation of the structure of FIG. 4 comprises a two-stage process whereby during a first time period certain switches are actuated into a closed position, while during a second time period certain switches are actuated into a open position. In this example embodiment, the default position for a switch is open or an open circuit. It is contemplated that in other embodiments or designs, the default position of the switches may be closed and the circuit operation would be adjusted accordingly.

The meaning of the alphanumeric designators associated with each switch block 4 may be defined as follows. Each alphanumeric designator begins with the T1 and T2 and represents whether a switch is closed during a time period T1 or T2 of a clock signal. Thus switch blocks having a T1 designation are closed during a time period T1 of the clock signal and open during time period T2 of the clock signal. Similarly, switch blocks having a T2 designation are active during the time period T2 of the clock signal and open during time period T1 of the clock signal. However, operation of switch blocks with the T2 designation are also subject to control by the digital signal. Thus, switches within the switch blocks 4 designated T20 are closed when the digital input comprises a zero, i.e. a logic level of zero. At all other times, these switches are in an open circuit state. In contrast, switches within the switch blocks 4 designated T21 are closed when the digital input comprises a one, i.e. a logic level of one. At all other times, these switches are in an open circuit state.

Figure 5A:
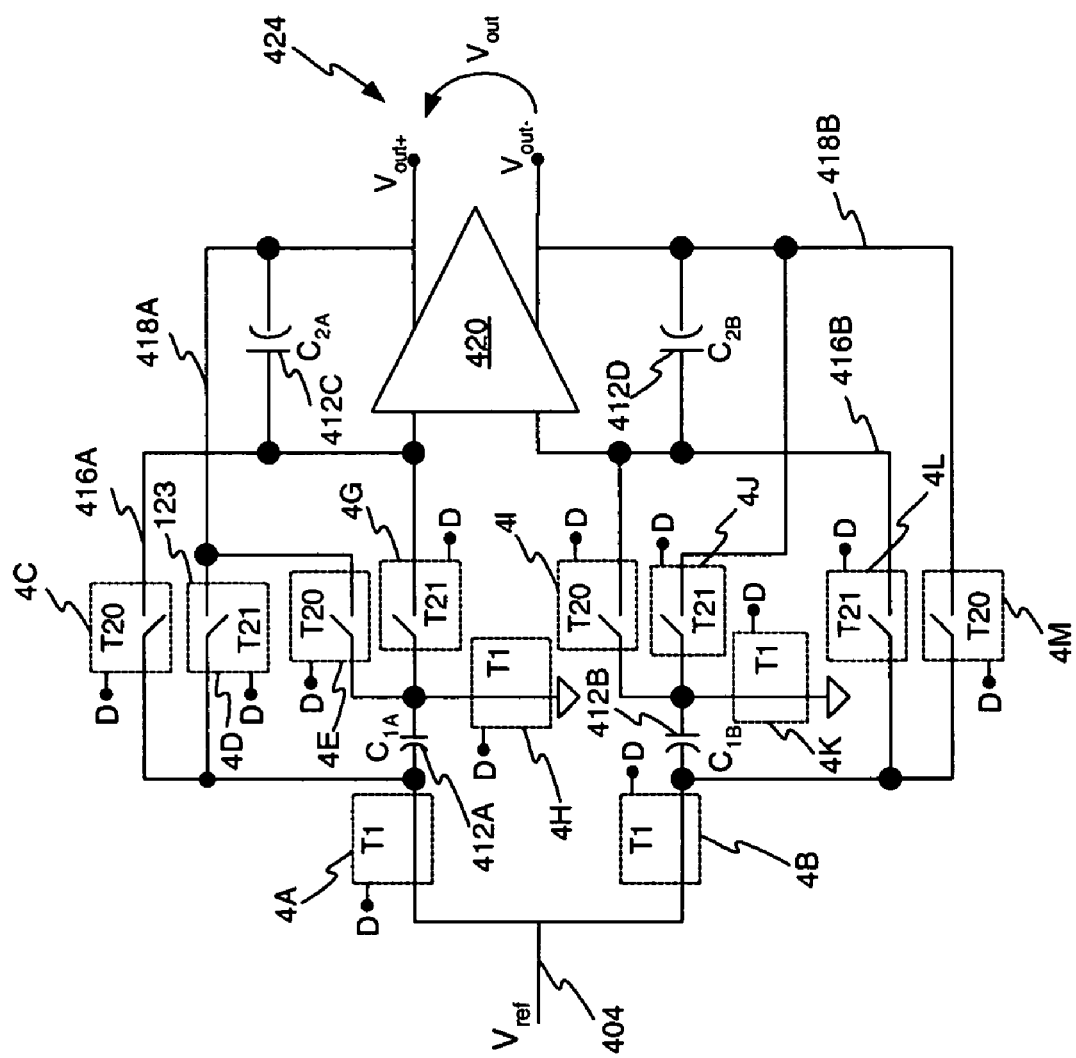
FIG. 5A illustrates a block diagram of the structure of FIG. 4, during a first time period T1, for a digital 1 input.

Working from this understanding of the switch states during the first time period (T1) and the second time period (T2), and how the digital input D controls the switches during the second time period, a discussion of the operation of the structure shown in FIG. 4 is now provided with reference to FIG. 5A. FIG. 5A illustrates a block diagram of the structure of FIG. 4, during a first time period T1, for a digital one input. As shown, the switches of switch blocks 4A, 4B, 4H and 4K are closed thereby charging capacitors 412A, 412B to the single reference voltage $V_{ref}$. As a result, the bottom plates of the capacitors 412A, 412B accumulate charge $V_{ref}$ with reference to ground as the top plate is connected to ground. As used herein, the term top plate refers to a capacitor plate shown with a straight line and the bottom plate refers to a capacitor plate shown with a curved line. As can be seen, all other switches, within the other switch blocks are open thereby preventing current flow or further charge accumulation.

Figure 5B:
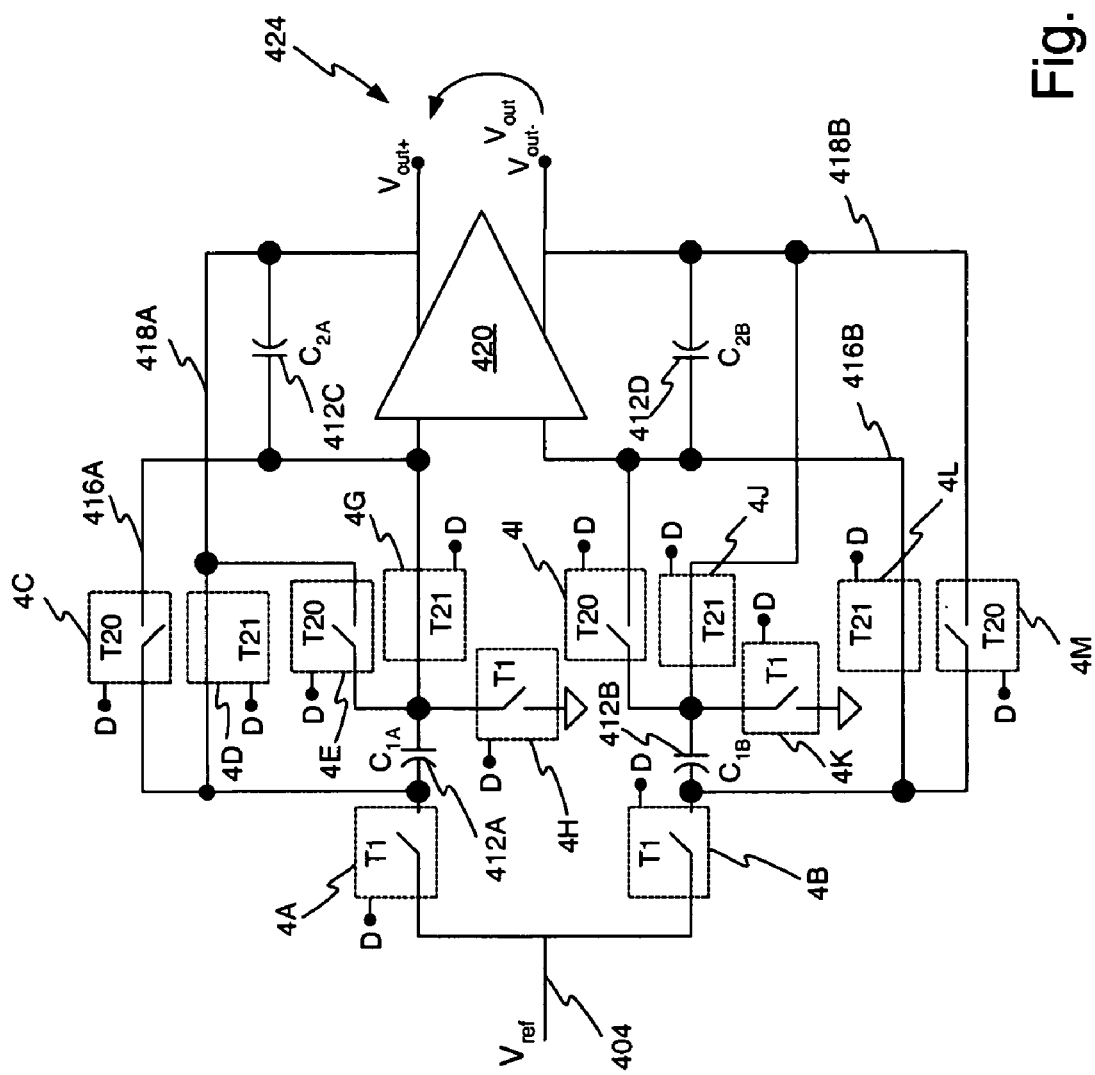
FIG. 5B illustrates a block diagram of the structure of FIG. 4, during a second time period T2, for a digital 1 input.

Turning now to FIG. 5B, the switch position of the switch blocks 4 is shown during a second time period for a digital one input. Working from the charge state shown in FIG. 5A, the switches within switch blocks with designators T1 are open as are the switches within switch blocks T20. The switches within switch blocks 4 with designator T21 are closed. As a result, the bottom plate (charged to $V_{ref}$ with reference to its bottom plate) of capacitor 412A connects to the output node 418A via switch block 4D, while the top plate of capacitor 412A connects via switch block 4G to the input node 416A of the amplifier 420. Since capacitor C2A is connected also across nodes 416A and 418A, capacitor 412A gets connected in parallel with the capacitor C2A during time period T2 with the top plate of capacitor 412A connected to node 416A and bottom plate connected to node 418A.

As can be seen graphically in FIG. 5B, the reference voltage, through the use of the charge accumulator capacitors, is provided as an output 424. Thus, this configuration enjoys the power saving benefits of a direct charge transfer device because the amplifier 420 does not have to provide current to charge any of the capacitors.

The charge accumulated as a result of the connections to $V_{ref}$ is directly provided on the output, $V_{out+}$ and the capacitor 412C accumulates this charge. Thus, this structure may be referred to as a sample and hold type structure because during the first time period (T1) the switches selectively sampled the reference voltage thereby allowing charge to be accumulated, while during a second time period (T2) the charge is held, such as by capacitor 412C.

Referring now to the structure shown on the bottom half of FIG. 5B, the top plate of capacitor 412B is connected via switch 4J to the node 418B, which is the output of the amplifier 420. The bottom plate of capacitor 412B is connected via switch 4L to node 416B which is an input to the amplifier 420. Since capacitor C2B is connected also across 416B and 418B, capacitor 412B gets connected in parallel with capacitor C2B during time period T2 with the top plate of capacitor 412B connected to node 418B and the bottom plate connected to node 416B.

With regard to charge accumulation over time, and hence, the generation of an analog signal that represents the digital signal, the capacitors 412C, 412D hold or store the charge over consecutive periods of the clock signal, i.e. two or more instances of T1 and T2. The capacitors hold the charge which represents the value of the digital signal. In this example embodiment, the amplifier is an inverting amplifier (negative or other type feedback). Consequently, a positive input provided to the input of the amplifier is inverted at its output to form a negative output and a negative input is inverted to create a positive output. Thus, if consecutive digital one values are provided to the structure, then the voltage on $V_{out}$ will continually increase.

Figure 5C:
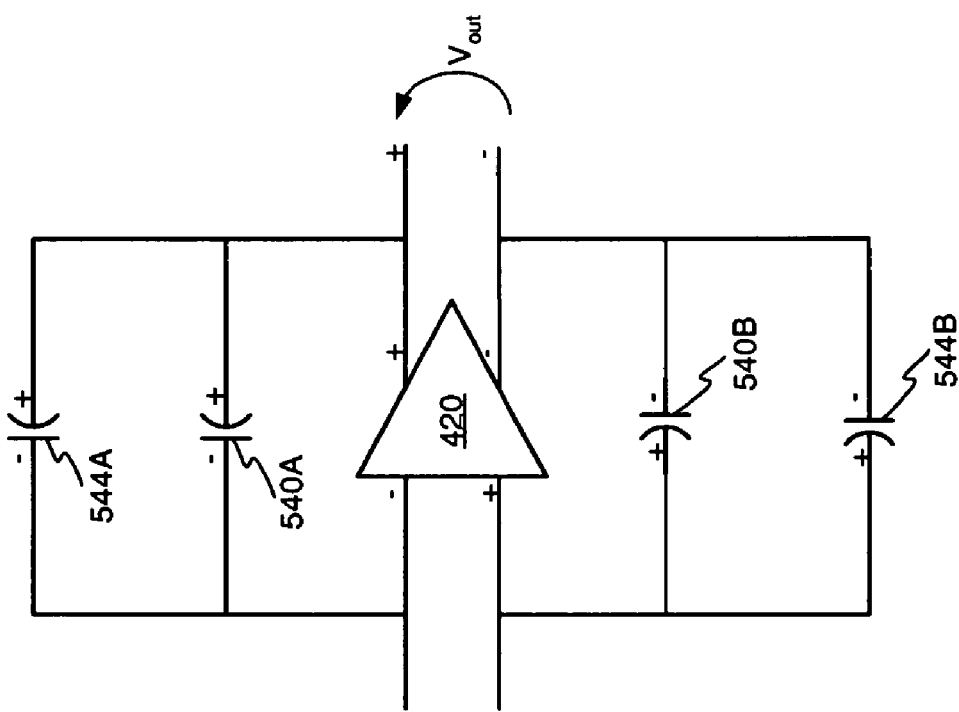
FIG. 5C illustrates a block diagram of charge accumulation in the circuit of FIG. 5A after the second phase of the clock period.

FIG. 5C illustrates a resulting equivalent charge structure after two consecutive digital one inputs. As shown, capacitors 540A, 540B represent the charge accumulation during a first digital one input. The bottom plate (curved plate) represents the plate charged to $V_{ref}$ with respect to its top plate. The capacitors 544A, 544B represents the charge accumulation during a second digital one input. As a result, $V_{out}$ comprises or is related to two times $V_{ref}$.

Figure 6A:
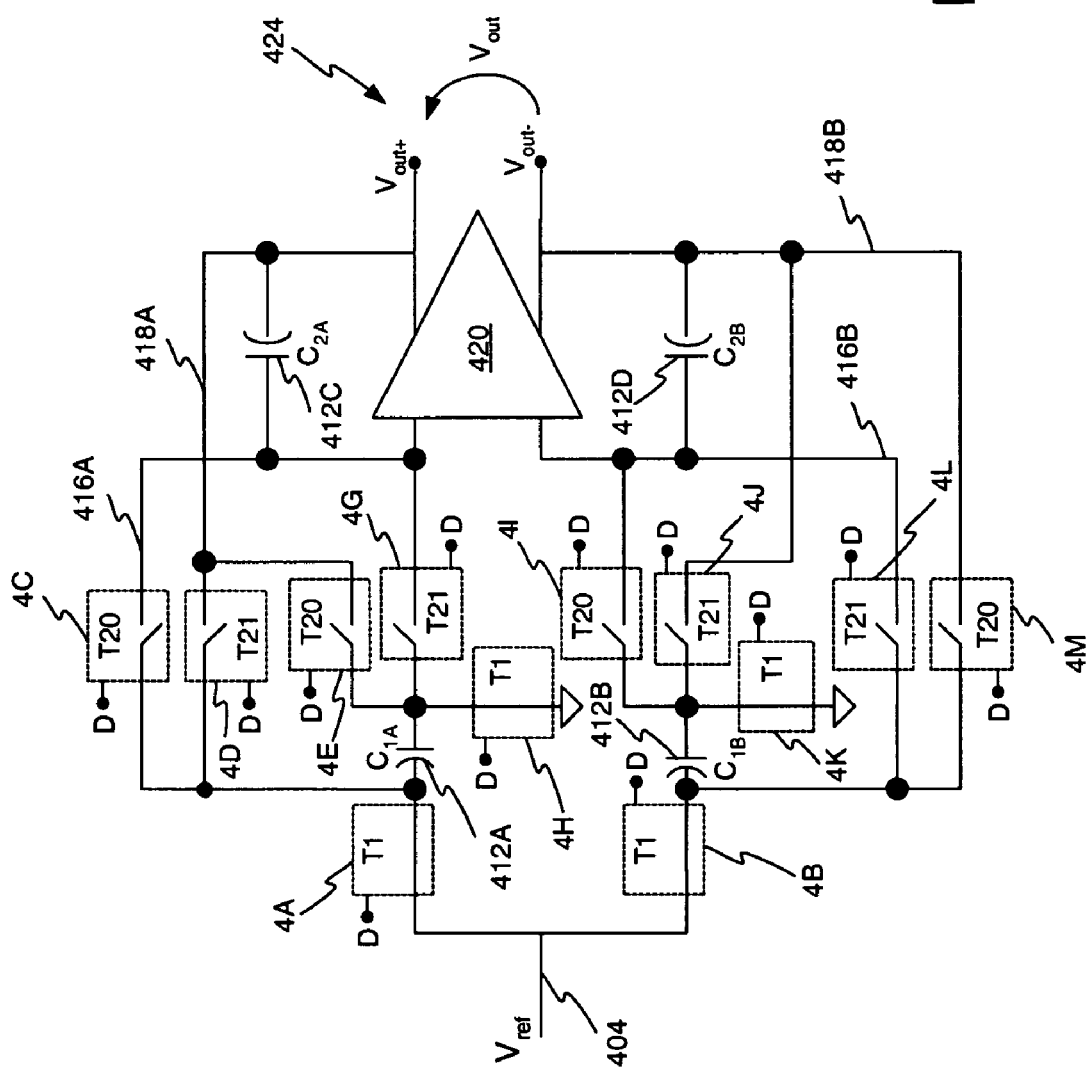
FIG. 6A illustrates a block diagram of the structure of FIG. 4, during a first time period T1, for a digital zero input.

FIG. 6A illustrates a block diagram of the structure of FIG. 4, during a first time period T1, for a digital zero input. As shown, during a first time period T1, switches in switch blocks 4A, 4B, 4H and 4K are closed while all other switches are in an open state. This manner of operation is generally identical to that describe above in FIG. 5A and hence, it is not discussed in detail again.

FIG. 6B illustrates the switch position of the switch blocks 4 during a second time period for a digital zero input. As shown, switches 4C, 4E, 4I, and 4M are closed while all other switches are open. Consequently, the bottom plate of capacitor C1A is connected to node 416A via switch 4C which is the input of the amplifier 420, and the top plate of capacitor C1A is connected to node 418A via switch 4E which is the output ($V_{out+}$) of the amplifier 420. In the bottom half of FIG. 6B, the top plate of capacitor C1B is connected to node 416B via switch 4I which is the input of the amplifier 420, and the bottom plate of capacitor C1B is connected to node 418B via switch 4M which is the output ($V_{out-}$) of the amplifier 420. In this manner, a digital zero value establishes an analog output signal. Over time, the charge accumulation on the capacitors 412C, 412D establishes an analog signal for $V_{out}$.

Figure 6C:
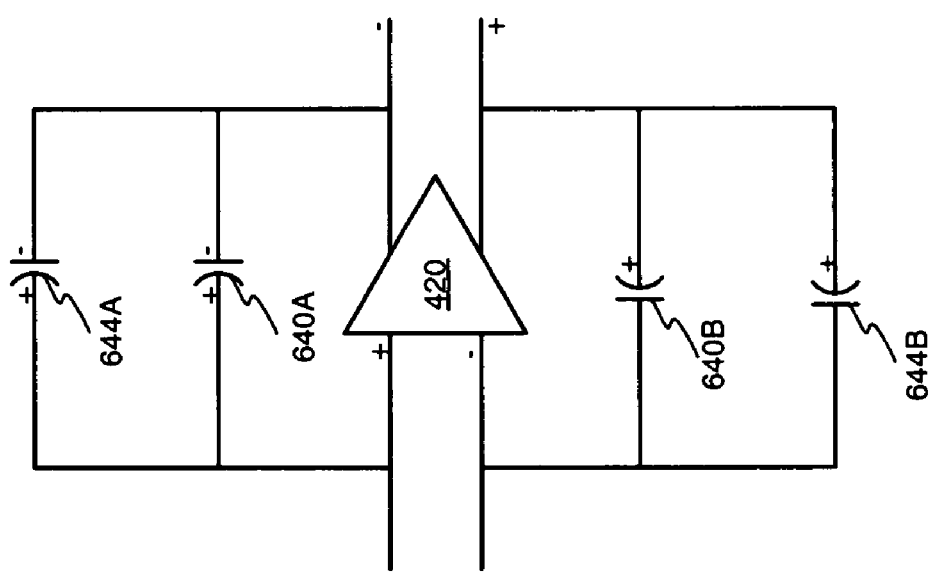
FIG. 6C illustrates a block diagram of charge accumulation in the circuit of FIG. 6A after the second phase of the clock period.

FIG. 6C illustrates a resulting equivalent structure after two consecutive digital zero inputs. As shown, capacitors 640A, 640B represent the charge accumulation during a first digital zero input. The bottom plate (curved plate) represents the plate charged to $V_{ref}$ with respect to its top plate. The capacitors 644A, 644B represent the charge accumulation during a second digital zero input. As a result, for consecutive digital zeros, $V_{out}$ comprises or is related to two times $V_{ref}$ but is of opposite polarity as compared to two consecutive digital one inputs.

In reference to FIG. 6C, during continued operation, a charge accumulates at output node 418A from digital one inputs while charge accumulation is reduced, at node 418A, when digital zero inputs are received and processed. In this manner, the analog output tracks the digital input over time.

Figure 7A:
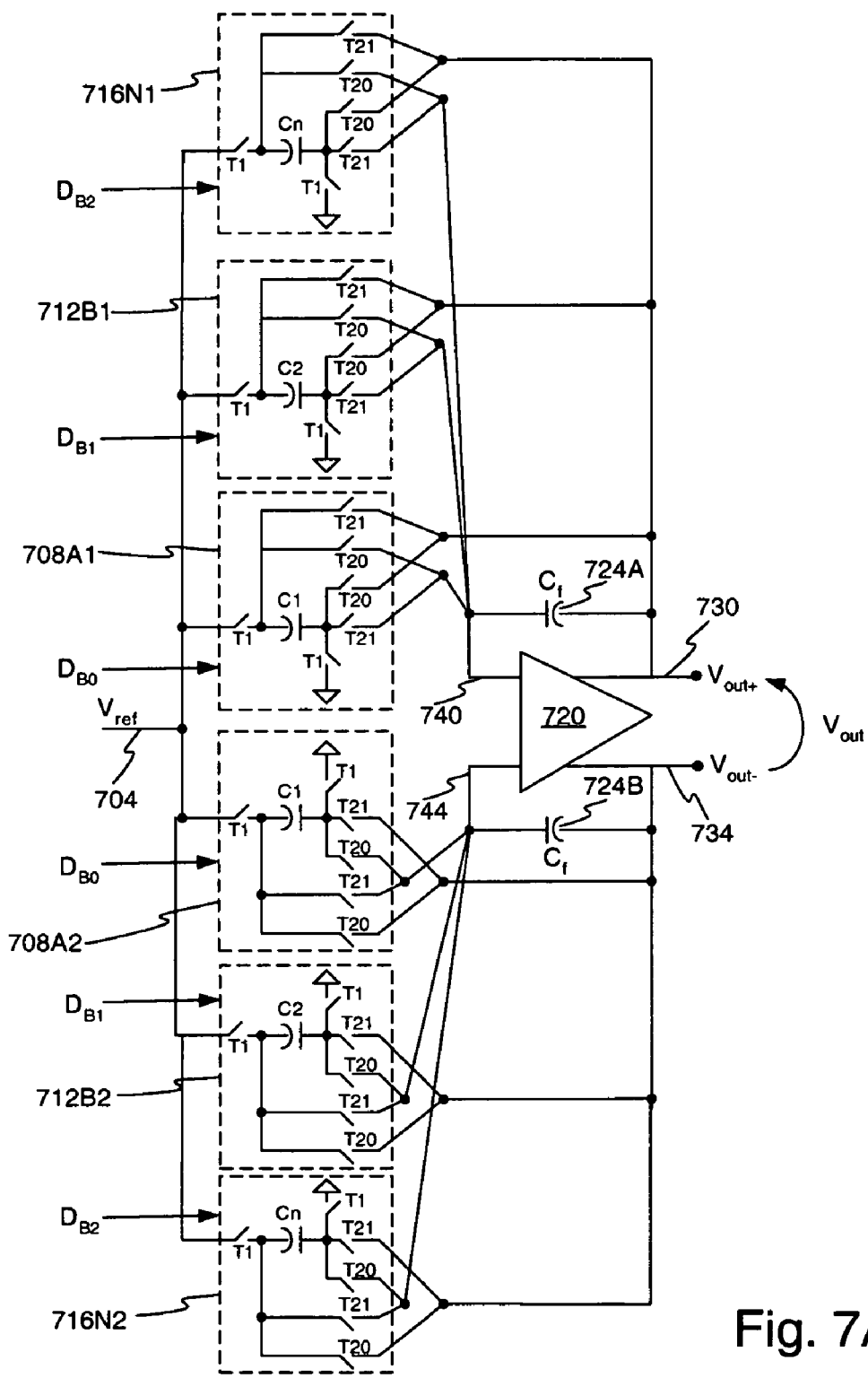
FIG. 7A illustrates an example embodiment of a multi-bit direct charge transfer digital to analog converter.

FIG. 7A illustrates an example embodiment of a multi-bit direct charge transfer digital to analog converter. The example embodiment shown in FIG. 7A is configured to convert a three bit digital input to an analog signal utilizing a single reference voltage. It should be mentioned that this principle can be extended to an n-bit digital input, where n is equal to any positive integer.

In general, the multi-switch assemblies 708, 712, 716 are configured to charge a charge storage device $C_1, C_2, \ldots C_N$ and, responsive to the values of the digital input, and selectively control the switches associated with the multi-switch assemblies to pass the charge on the charge storage devices $C_f$ connected across the amplifier input and output. The identifier N represents any positive whole number and, as such, the structure of FIG. 7A may be configured to accommodate any size digital input.

As shown, a single reference voltage 704 is provided to multi-switch assemblies 708A1, 708A2, 712B1, 712B2, 716N1 and 716N2. In this embodiment, the multi-switch assemblies 708A1, 708A2, 712B1, 712B2, 716N1 and 716N2 comprise one or more switches and charge collection devices as shown. The outputs of the multi-switch assemblies 708A1, 708A2, 712B1, 712B2, 716N1 and 716N2 connect to either the input or the output of an amplifier 720 as shown. In this example embodiment, each multi-switch assembly 708A1, 708A2, 712B1, 712B2, 716N1 and 716N2 has an output that connects to the input of the amplifier 720 and an output that connects to the output of the amplifier. In the embodiment shown in FIG. 7A, the amplifier 720 comprises a differential amplifier and as such, multi-switch assemblies 708A1, 712B1, 716N1 connect to the positive or upper amplifier terminals while multi-switch assemblies 708A2, 712B2, 716N2 connect to the negative or lower amplifier terminals.

Charge storage devices in the form of capacitors 724A, 724B connect across the amplifier input and output. For example, capacitor 724A is connected across nodes 740 and 730 which form the input and output of a differential amplifier and capacitor 724B is connected across nodes 744 and 734. The positive output terminal 730 provides a signal $V_{out+}$ while the negative output terminal 730 of the amplifier 720 provides a signal $V_{out-}$.

The digital signal D is provided to the multi-switch assemblies 708A1, 708A2, 712B1, 712B2, 716N1, 716N2 to control the switch during one or more of the first time period and the second time period of a clock signal or other reference signal. In one embodiment, the switch operation may occur independent of the digital signal. In this embodiment, the digital signal D represents a three bit digital value. The first bit or least significant bit of the digital signal D comprises $D_{B0}$ which is provided to multi-switch assemblies 708A1, 708A2. The second bit or second least significant bit of the digital signal D comprises $D_{B1}$ which is provided to multi-switch assemblies 712B1, 712B2. The third bit or most significant bit of the digital signal D comprises DB2 which is provided to multi-switch assemblies 716N1, 716N2.

Based on the value of the bits, the switches in the multi-switch assemblies 708A1, 708A2, 712B1, 712B2, 716N1, 716N2 are selectively closed and opened to establish charge on the charge collection devices within the multi-switch assemblies. Because each of the multi-switch assemblies 708A1, 708A2, 712B1, 712B2, 716N1, 716N2 is responsive to a particular bit of the digital signal. In this manner, the various digital values generate unique analog values. In one embodiment weighting of the charge that is accumulated in may also occur.

Figure 7B:
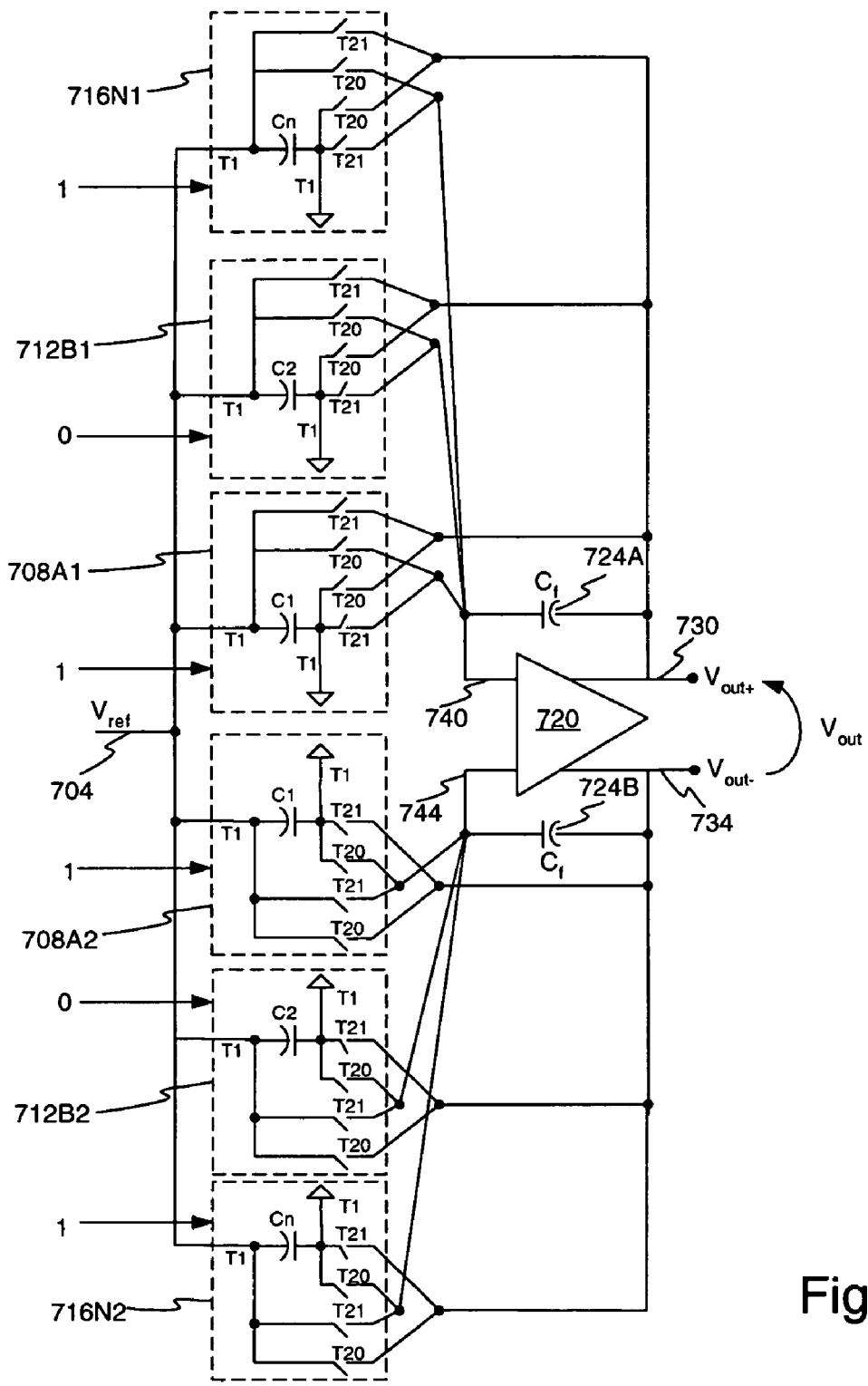
FIG. 7B illustrates an example embodiment of the structure of FIG. 7A for a digital input of 101 during a first time period T1.

FIG. 7B illustrates an example embodiment of the structure of FIG. 7A for a digital input of 101 during a first time period T1. As shown, the digital input is provided on the digital input lines to the multi-switch assemblies 708A1, 708A2, 712B1, 712B2, 716N1, 716N2. The switches within the multi-switch assemblies 708A1, 708A2, 712B1, 712B2, 716N1, 716N2 are controlled based on the values of the digital inputs. In this embodiment, a digital one value, i.e. the most significant bit is provided to multi-switch assemblies 716N1, 716N2. A digital zero is provided to multi-switch assemblies 712B1, 712B2 while the least significant bit, a digital one value, is provided to multi-switch assemblies 708A1, 708A2.

As shown in FIG. 7B, during the first time period (T1) all of the switches labeled T1 are closed while all switches having notation T2x are open, where x may comprise a 0 or a 1 to represent a digital zero value or a digital one value. As a result of the closure of switches T1, the bottom plate (curved plate) of capacitors $C_1$, $C_2$, $C_N$, are charged to $V_{ref}$ with respect to the top plate as shown.

Figure 7C:
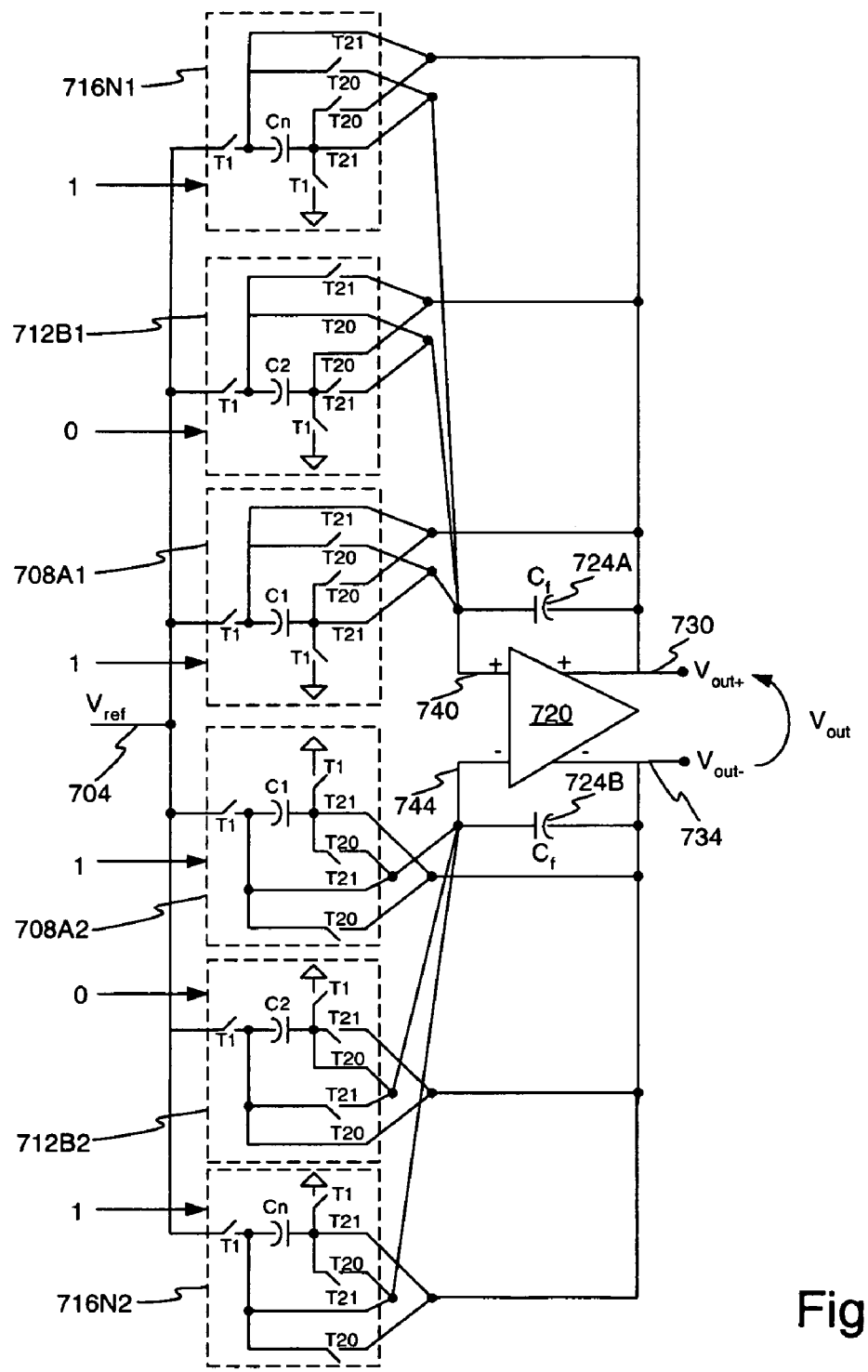
FIG. 7C illustrates an example embodiment of the structure of FIG. 7A for a digital input of 101 during a second time period T2.

FIG. 7C illustrates switch position during a second time period T2 for a digital input 101. As shown, during time period T2, switches T1 are now open. For switch assemblies receiving a digital one input, the switches T21 contained therein are closed while switches T20 are open. Conversely, for switch assemblies receiving a digital zero input, the switches T20 contained therein are closed while switches T21 are open. As a result, the switch assemblies 708A1, 708A2, 716N1 and 716N2 that receive a digital one input connect the top plate of their capacitors or charge storage device to one of the inputs of the amplifier 720. In this embodiment, switch assemblies 708A1, 716N1 are connected to input node 740 of the amplifier 720 and switch assemblies 708A2, 716N2 are connected to input node 744 of the amplifier 720. The switch assemblies 712B1 and 712B2 that receive a digital zero input connect the top plate of their capacitors or charge storage devices to one of the outputs of the amplifier 720. Switch assembly 712B1 is connected to node 730 and switch assembly 712B2 is connected to node 734.

Because of the switch closures in the switch assemblies 708A1, 708A2, 712B1, 712B2, 716N1, 716N2 charge is transferred to the outputs of the digital to analog converter to generate $V_{out}$. In this manner, the direct charge transfer is achieved.

Switch assemblies 708A1, 708A2, 716N1, 716N2 connect the top plate of capacitors $C_1$ and $C_N$ to the input terminals (node 740 and node 744) of the amplifier 720. The switch assemblies 712B1 and 712B2 connect the top plate of capacitor C2 to the output terminals 730, 734 of the amplifier 720. Hence, if capacitors C1 and CN in switch assemblies 708A1 and 716N1 deliver a positive charge to the capacitor $C_f$, then capacitor C2 in switch assembly 712B1 delivers a negative and opposite charge to the capacitor $C_f$. Thus, the digital one inputs increase the differential between $V_{out+}$ and $V_{out-}$ which in turn increases $V_{out}$. While the digital zero inputs decrease the differential between $V_{out+}$ and $V_{out-}$.

As a result, the various digital input values which may be provided to the digital inputs of the switch assemblies 708A1, 708A2, 712B1, 712B2, 716N1, 716N2 control the value of the analog output. As understood in the art, value or voltage weighting would occur to correspond to the significance or position of each digital bit in the digital input. The term digital input is defined to mean the input to the digital to analog converter and the digital input may comprise any number of bits. In this example embodiment, three digital bits are used. As stated above, the value N may comprise any number and as such, the structure of FIG. 7 may be adapted to any size digital input, i.e. any number of bits.

Figure 8:
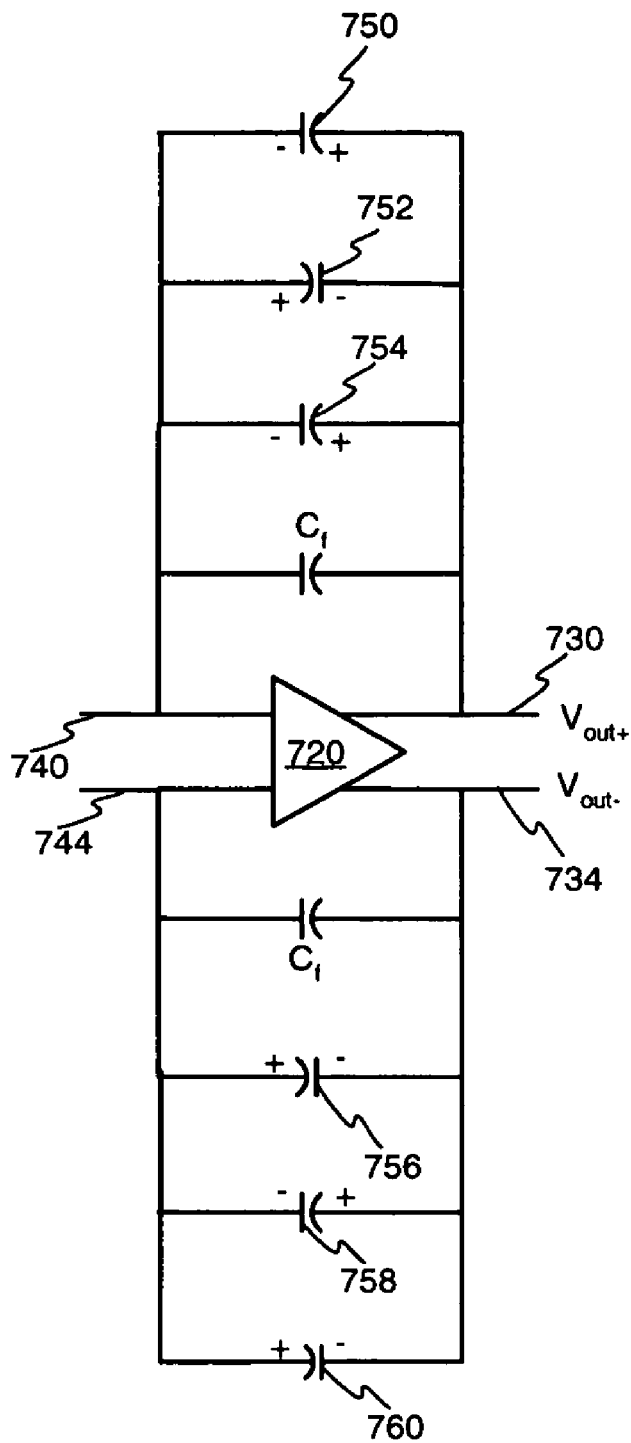
FIG. 8 illustrates an equivalent charge structure as would be generated by the structure of FIG. 7 when presented with a digital one-zero-one value.

FIG. 8 illustrates an equivalent charge structure as would be generated by the structure of FIG. 7 when presented with a digital 101 value. As shown in the top portion of FIG. 8, capacitors 750, 754 have their bottom plates connected to the positive output terminal 730 of the amplifier 720 and the top plates are connected to the input of the inverting amplifier 720. For capacitor 752, its top plate is connected to the positive output terminal 730 of the amplifier 720 while its bottom plate is connected to the input of the inverting amplifier 720. Because of the switch assemblies connecting either the top plate or the bottom plate of the capacitors (depending on the digital input value) to the output of the amplifier, the analog output $V_{out}$ is represented by the combination of charge from capacitors 750, 752, 754. This may be written as $xV_{ref} - yV_{ref} + zV_{ref}$ where the variables x, y, and z represent the weighting values for each bit location.

Turning to the bottom of FIG. 8, the bottom plates of capacitors 756, 760 are connected to the input of the inverting amplifier 720 while the bottom plate of capacitor 758 connects to the output terminal 734. The charge at the output terminal 734 comprises $-xV_{ref} + yV_{ref} - zV_{ref}$. The voltage $V_{out}$ comprises the difference between $V_{out+}$ and $V_{out-}$.

While various embodiments of the invention have been described, it will be apparent to those of ordinary skill in the art that many more embodiments and implementations are possible that are within the scope of this invention.

What is claimed is:

1. A method for converting a digital signal to an analog signal utilizing a single reference voltage comprising:
providing a reference voltage;
providing a first terminal of a first switch connected to the reference voltage;
providing a second terminal of the first switch connected to a bottom plate of a capacitor, the capacitor also having a top plate, and wherein the switch is configured to establish an open circuit or connect the reference voltage to the capacitor;
providing one or more additional switches connected to the bottom plate and top plate of the capacitor;
during a first time period connecting the bottom plate of the capacitor to the reference voltage to thereby charge the bottom plate of the capacitor; and responsive to a digital signal, during a second time period selectively connecting either of the top plate or the bottom plate of the capacitor to an amplifier input or output to generate an output signal representative of the digital signal.

2. The method of claim 1, wherein the top plate of the capacitor receives a positive charge.

3. The method of claim 1, further comprising providing the output signal to an amplifier.

4. The method of claim 3, wherein providing the output signal to an amplifier comprises providing the output signal to either an amplifier input or an amplifier output.

5. The method of claim 1, wherein the charge on the capacitor is directly coupled to the output.

6. A method for performing a direct charge transfer digital to analog conversion comprising:
   receiving a digital signal;
   providing the digital signal to one or more switch assemblies;
   connecting the one or more switch assemblies from an open circuit state to one or more voltage sources having a common voltage to thereby establish a charge within the one or more switch assemblies; and
   responsive to the digital signal, selectively connecting the charge, positive, negative, or both, established within the one or more switch assemblies, to an input of an amplifier to thereby convert the digital signal to an analog signal.

7. The method of claim 6, wherein the one or more switch assemblies comprise capacitors and switches.

8. The method of claim 6, wherein the charge is established on one or more capacitors.

9. The method of claim 6, wherein selectively connecting the charge established within the switch assemblies to an output comprises selectively connecting the charge to either an amplifier input or an amplifier output.

10. The method of claim 9, wherein the amplifier is an inverting amplifier.

11. A system for converting a digital signal to an analog signal comprising:
    a reference voltage node configured to provide a charge;
    a charge collection device having at least one positive charge collection node and at least one negative charge collection node configured to store a charge;
    a first switch assembly having at least one switch configured to selectively connect the charge collection device to the reference voltage node; and
    a second switch assembly having at least one switch configured to selectively convey the charge on either or both of the at least one positive charge collection node or the at least one negative charge collection node of the charge collection device to an output of the system or an input of an amplifier, wherein the at least one switch of the second switch bank is responsive to the digital signal.

12. The system of claim 11, wherein the charge collection device comprises a capacitor.

13. The system of claim 11, wherein the output of the system comprises an analog signal.

14. The system of claim 11, further comprising an amplifier and charge accumulation device connected to the output of the system to hold the analog voltage over time.

15. The system of claim 14, wherein the charge accumulation device comprises a capacitor and the amplifier comprises a differential amplifier.

16. The system of claim 11, wherein the second switch assembly comprises two or more switches configured to connect the charge to either a positive output or a negative output of the system.

17. A digital signal to analog signal converter comprising:
    an electrical charge source;
    one or more charge storage devices;
    one or more switches configured to connect, during a first time period, the one or more charge storage devices to the charge source and during a second time period establish an open circuit with the one or more charge storage devices to thereby maintain charge on at least one of the charge storage devices; and
    one or more switches configured to connect the one or more charge storage devices to an output node of the digital signal to analog signal converter or to an input of an amplifier, wherein connecting the one or more charge storage devices to an output node or to the input of the amplifier occurs during a second time period and is responsive to the digital signal.

18. The converter of claim 17, wherein the one or more switches configured to connect the charge storage device to an output node comprise one or more switches configured to connect the charge to a positive output node in response to a digital one value and one or more switches configured to connect the charge to a negative output node in response to a digital zero value.

19. The converter of claim 18, wherein the negative output node and the positive output node comprise output nodes of a differential amplifier.

20. The converter of claim 17, further comprising one or more output capacitors configured to hold a charge over time to thereby maintain an analog signal.

21. The converter of claim 17, wherein the one or more charge storage devices comprise one or more capacitors and the charge source comprises a voltage source or a current source.

22. A system for direct charge transfer of a digital signal to an analog signal comprising:
    means for receiving a digital signal;
    means for providing the digital signal to one or more switch assemblies;
    means for connecting the one or more switch assemblies to a single voltage source and establishing an open circuit to thereby establish a charge within the one or more switch assemblies; and
    means for selectively connecting the charge established within the switch assemblies to an output or to an amplifier input to thereby convert the digital signal to an analog signal, wherein the means for selectively connecting operates responsive to the digital signal.

23. The system of claim 22, wherein the means for connecting comprises one or more switches.

24. The system of claim 22, wherein during a first time period the charge is established and during a second time period the charge is converted to the analog signal.

25. The system of claim 22, further comprising means for holding the charge to thereby establish an analog signal that tracks the digital signal over time.

* * * * *